(12) United States Patent
Shiota et al.

(10) Patent No.: US 7,868,436 B2
(45) Date of Patent: Jan. 11, 2011

(54) SEMICONDUCTOR DEVICE

(75) Inventors: Hiroki Shiota, Tokyo (JP); Hirotaka Muto, Tokyo (JP); Tetsuo Mizoshiri, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 306 days.

(21) Appl. No.: 11/742,057

(22) Filed: Apr. 30, 2007

(65) Prior Publication Data

US 2007/0284719 A1    Dec. 13, 2007

(30) Foreign Application Priority Data

May 11, 2006    (JP)    ............................ 2006-132114

(51) Int. Cl.
*H01L 23/02*    (2006.01)
(52) U.S. Cl. .................. 257/678; 257/690; 257/701
(58) Field of Classification Search ................ 257/678, 257/690–692, 701; 438/106
See application file for complete search history.

(56) References Cited

U.S. PATENT DOCUMENTS

| | | | | |
|---|---|---|---|---|
| 6,084,297 A * | 7/2000 | Brooks et al. | ................ | 257/698 |
| 6,670,214 B1 * | 12/2003 | Chia et al. | .................. | 438/106 |
| 6,882,546 B2 * | 4/2005 | Miller | ......................... | 361/783 |
| 6,982,482 B2 * | 1/2006 | Glidden et al. | .............. | 257/723 |
| 2002/0179974 A1 * | 12/2002 | Noda et al. | ................. | 257/369 |

FOREIGN PATENT DOCUMENTS

| | | |
|---|---|---|
| JP | 7-30015 | 1/1995 |
| JP | 2006-202930 | 8/2006 |

* cited by examiner

*Primary Examiner*—Zandra Smith
*Assistant Examiner*—Paul E Patton
(74) *Attorney, Agent, or Firm*—Oblon, Spivak, McClelland, Maier & Neustadt, L.L.P.

(57) ABSTRACT

A semiconductor device includes an insulator substrate mounted on a base plate, the insulator substrate having an upper electrode, semiconductor chips mounted on the insulator substrate, external terminals for establishing external electrical connections of the semiconductor device, wires for establishing electrical connections among the external terminals, the upper electrode and the semiconductor chips, a case accommodating the insulator substrate, the semiconductor chips, the external terminals and the wires which are sealed by a sealing material filled in the case, a lid for protecting an upper part of the sealing material, and an insulative low electrification covering fitted on each wire, the low electrification covering having a lesser tendency to produce an electric charge buildup than the sealing material.

14 Claims, 4 Drawing Sheets

SEMICONDUCTOR DEVICE

BACKGROUND OF THE INVENTION

1. Field of the Invention

The present invention relates to a semiconductor device in which injection of electric charge from an electric charge source is restricted to provide highly reliable insulating performance.

2. Description of the Background Art

There is a growing demand today for a power module suited for reliably controlling a large current flowing in such electric apparatuses as motors and heaters. One requirement in the design of this kind of power module is to structure the same to provide a high withstand voltage retaining capability so that a leak current which may flow other than through an ordinary current path will not flow between a collector (positive electrode) and an emitter (negative electrode) to which an extremely high voltage is applied, for instance. A structure having such a high withstand voltage retaining capability is obtained by use of a power semiconductor chip like an insulated-gate bipolar transistor (IGBT) and insulative sealing resin for packaging the power semiconductor chip, for example. One conventionally known example of a structure having a high withstand voltage retaining capability is a guard ring structure which typically includes a plurality of guard rings separated from one another running along an outer peripheral region of an upper surface of a semiconductor chip and a plurality of capacitive elements made of an insulating material like sealing resin filled between the adjacent guard rings. The guard ring structure thus formed reduces an electric field produced along the surface of the semiconductor chip and suppresses the leak current. The guard ring structure formed in the outer peripheral region of the semiconductor chip serves to provide an increased dielectric withstand voltage in surface directions between an emitter located in a central region of the upper surface of the semiconductor chip and a collector located below the emitter.

On the other hand, Japanese Patent Application Publication No. 1995-30015 proposes a structure for providing high breakdown voltage characteristics. Intended to avoid a leak current under high-temperature and high-humidity conditions, this structure is to cover side surfaces and at least an outer peripheral region of an upper surface of each semiconductor chip with a first insulating material having a modulus of elasticity of $10^6$ dyn/cm$^2$ or more and fill a second insulating material having a modulus of elasticity of $10^6$ dyn/cm$^2$ or less into a space in an insulative package. Even if water intrudes into the insulative package from outside through a crack which has formed in the second insulating material and remains therein in a semiconductor device thus structured, the first insulating material keeps the water from reaching the side surfaces and the peripheral region of the upper surface of each semiconductor chip, thereby preventing the occurrence of a leak current. According to the aforementioned Publication, the structure serves to prevent degradation of the breakdown voltage characteristics due to water existing on the side surfaces and the peripheral region of the upper surface of each semiconductor chip under high-temperature and high-humidity conditions.

Generally, a leak current increases in a conventional semiconductor device even under room temperature conditions when a high voltage is applied across an emitter and a collector and this may develop a device failure like incorrect switching and breakdown due to overcurrent of a semiconductor chip, such an IGBT chip or a diode chip. This kind of leak current is supposed to increase when a negative charge accumulates in a guard ring due to a strong electric field produced between a conductive wire electrically connected to the emitter and the guard ring, resulting in excessive formation of a depletion layer in a multilayer structure of the semiconductor device and allowing the leak current to flow through the depletion layer. Another problem of the conventional semiconductor device is that if a wire which is a source of electric charge is located immediately above a guard ring where the electric field is maximized, the wire continuously supplies the electric charge and the amount of electric charge injected into sealing material increases with time, which could cause an increase in the leak current and eventual malfunctioning of a semiconductor chip. In a case where a silicon carbide (SiC) chip having a higher operating temperature is used instead of a silicon chip, for instance, the electric charge can more easily be injected into sealing material. This also develops a problem that malfunctioning of the semiconductor chip can occur due to an increase in the leak current.

SUMMARY OF THE INVENTION

In light of the aforementioned problems of the prior art, it is an object of the invention to provide a semiconductor device featuring highly reliable insulating performance by restricting injection of electric charge from an electric charge source that can cause an increase in leak current.

According to the invention, a semiconductor device includes an insulator substrate mounted on a base plate, the insulator substrate having an electrode, a semiconductor chip mounted on the insulator substrate, external terminals for establishing external electrical connections of the semiconductor device, means for establishing electrical connections among the external terminals, the electrode and the semiconductor chip, a case accommodating the insulator substrate, the semiconductor chip, the external terminals and the means for establishing electrical connections which are sealed by a sealing material filled in the case, a lid for protecting an upper part of the sealing material, and an insulative low electrification material covering the means for establishing electrical connections, the low electrification material having a lesser tendency to produce an electric charge buildup than the sealing material.

In the semiconductor device thus structured, the low electrification material fitted on the means (wires) for establishing electrical connections serves to substantially restrict injection of electric charge from the wires into the sealing material and suppress an increase in leak current caused by the injected electric charge.

The foregoing and other objects, features, aspects and advantages of the present invention will become more apparent from the following detailed description when read in conjunction with the accompanying drawings.

DETAILED DESCRIPTION OF THE PREFERRED EMBODIMENTS OF THE INVENTION

The invention is now described in detail with reference to preferred embodiments thereof which are illustrated in the accompanying drawings.

First Embodiment

Figure 1:
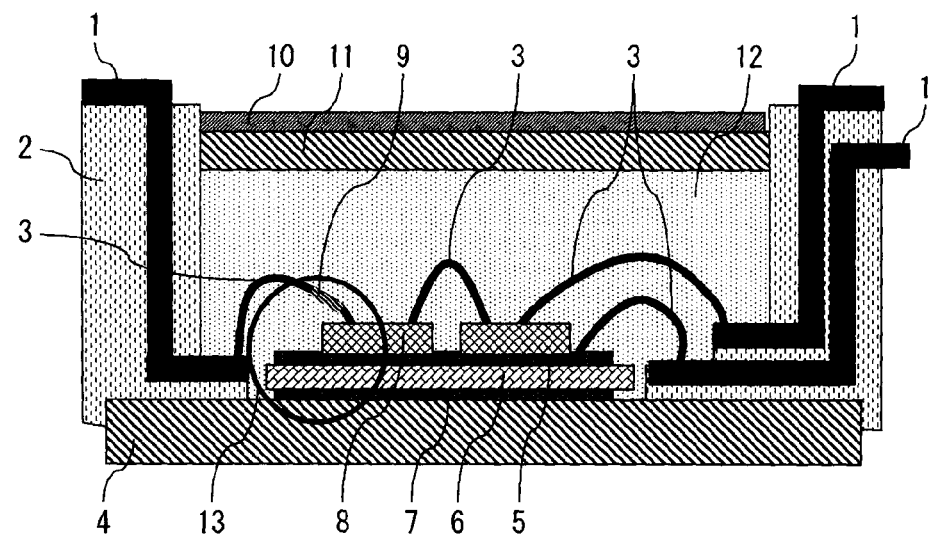
FIG. 1 is a cross-sectional view generally showing the structure of a semiconductor device according to a first embodiment of the invention.
Figure 2:
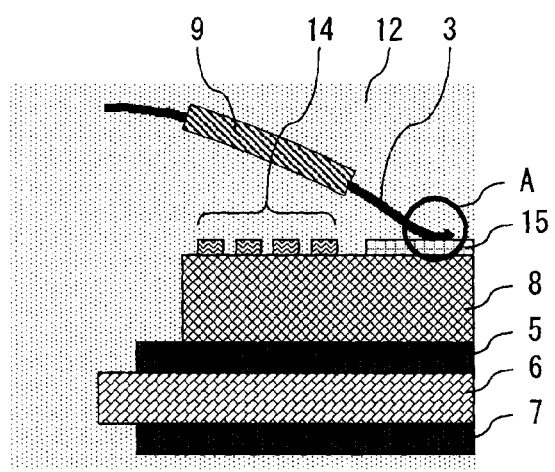
FIG. 2 is a cross-sectional view showing the structure of a portion (shown by a circle marked by the numeral 13) of the semiconductor device of FIG. 1 near guard rings of one of semiconductor chips.
Figure 3:
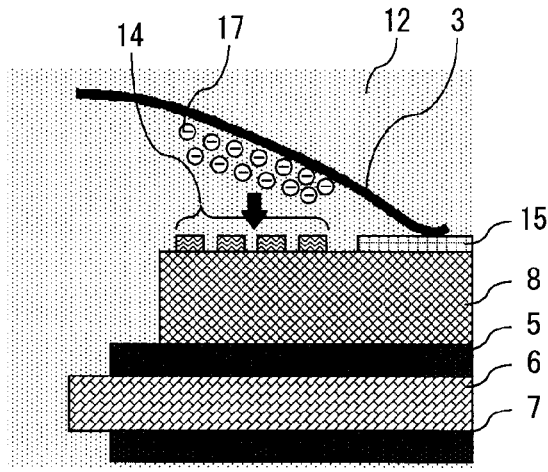
FIG. 3 is a cross-sectional view showing as a comparative example the structure of a portion of a semiconductor device near guard rings of one of semiconductor chips in which a wire is not fitted with a low electrification covering.
Figure 4:
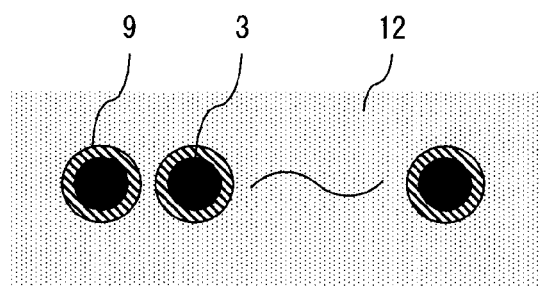
FIG. 4 is a cross-sectional view showing a principal part of the semiconductor device according to the first embodiment shown in FIG. 1.
Figure 5:
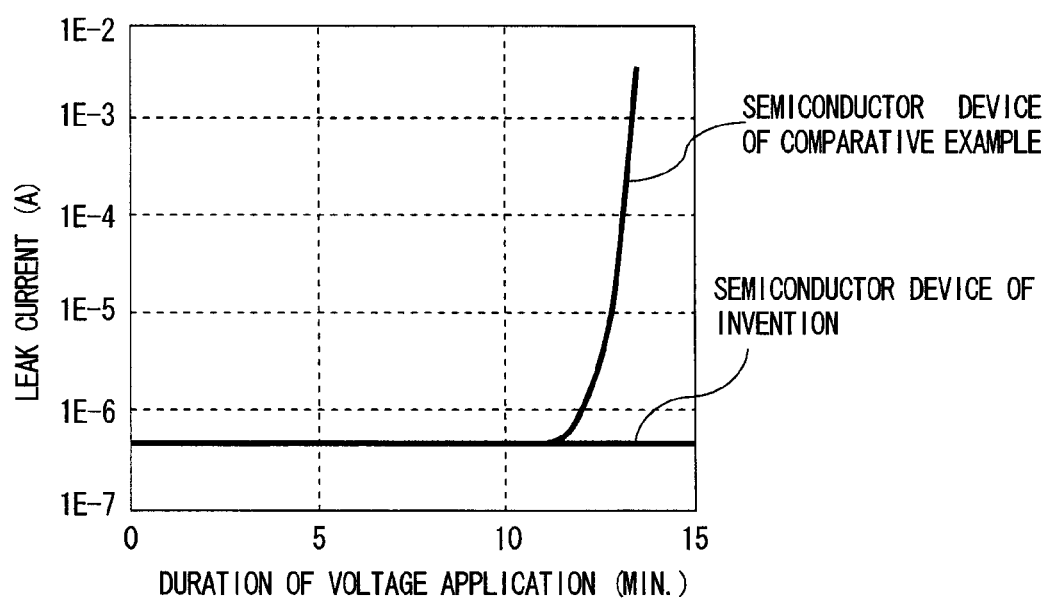
FIG. 5 is a diagram showing a comparison of time durations until leak currents begin to flow in the semiconductor device of the first embodiment and in the comparative example.
Figure 6:
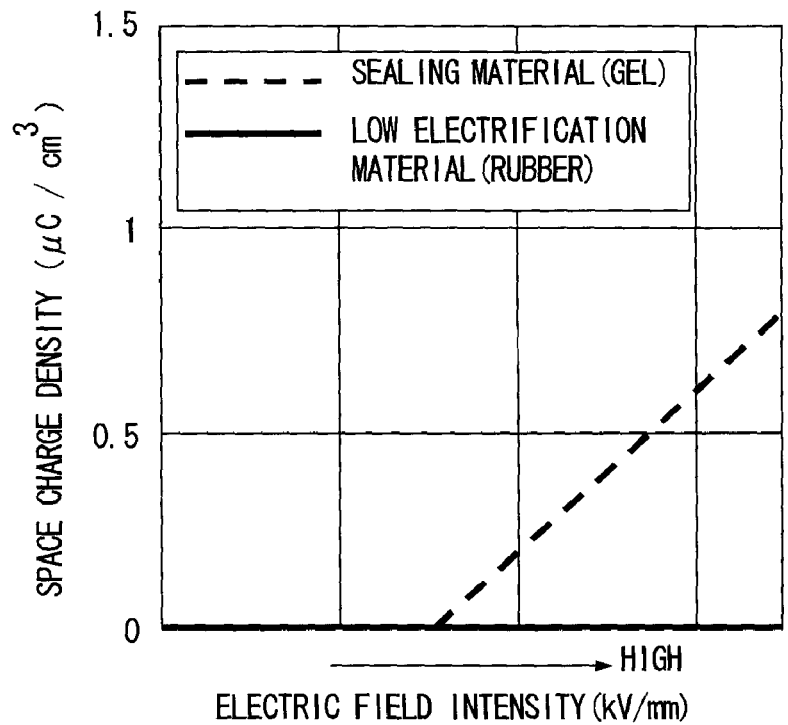
FIG. 6 is a diagram showing how easily a space charge is produced with a sealing material and a low electrification material.
Figure 7:
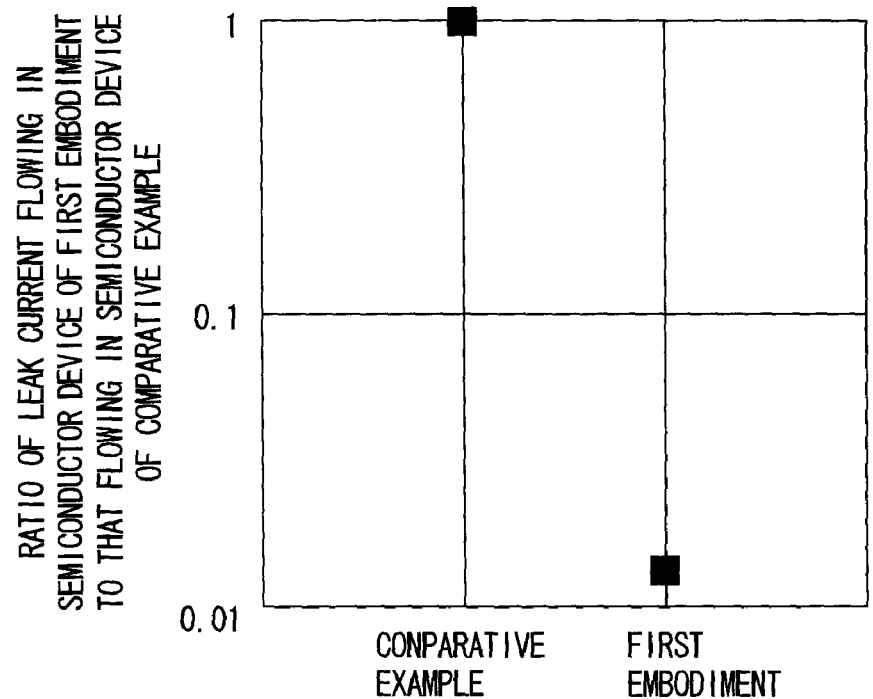
FIG. 7 is a diagram showing a comparison of leak currents (average values) which flow in the semiconductor device of the first embodiment and that of the comparative example.

FIG. 1 is a cross-sectional view generally showing the structure of a semiconductor device according to a first embodiment of the invention, FIG. 2 is a cross-sectional view showing the structure of a portion (shown by a circle marked by the numeral 13) of the semiconductor device of FIG. 1 near guard rings 14 of one of semiconductor chips 8, FIG. 3 is a cross-sectional view showing as a comparative example the structure of a portion of a semiconductor device near guard rings 14 of one of semiconductor chips 8 in which a wire 3 is not fitted with a low electrification covering 9, FIG. 4 is a cross-sectional view showing a principal part of the semiconductor device according to the first embodiment shown in FIG. 1, FIG. 5 is a diagram showing a comparison of time durations until leak currents begin to flow in the semiconductor device of the first embodiment and in the comparative example, FIG. 6 is a diagram showing how easily a space charge is produced with a sealing material and a low electrification material, and FIG. 7 is a diagram showing a comparison of leak currents (average values) which flow in the semiconductor device of the first embodiment and that of the comparative example.

Referring to FIG. 1, the semiconductor device includes a base plate 4, an insulator substrate 6 disposed on the base plate 4, the insulator substrate 6 having an upper electrode 5 and a lower electrode 7 which is joined to the base plate 4 by soldering, for instance, a plurality of semiconductor chips 8, such as IGBTs or diodes which are disposed on the insulator substrate 6, the semiconductor chips 8 being joined to the upper electrode 5 by soldering, for instance, a plurality of external terminals 1 for establishing external electrical connections of the semiconductor device, a plurality of wires 3 for establishing electrical connections between the semiconductor chips 8 and the external terminals 1, between one semiconductor chip 8 and another and between the external terminals 1 and the upper electrode 5, and a case 2 accommodating individual elements of the semiconductor device, where the "individual elements" include the external terminals 1, the insulator substrate 6, the upper electrode 5, the lower electrode 7, the base plate 4 and the wires 3. To encapsulate these elements, a sealing material 12 like silicone gel is filled in the case 2 of which top side is closed by a protective resin cover 11 made of epoxy resin, for instance, and a lid 10 for protecting an upper part of the sealing material 12. As depicted in FIG. 2, part of each wire 3 is wrapped by an insulative low electrification covering 9 which produces a lesser electric charge buildup than the sealing material 12.

Given below is a detailed description of how the low electrification covering 9 is provided. There are provided guard rings 14 on each semiconductor chip 8 for reducing an electric field formed thereon. While each wire bonding area is surrounded by four guard rings 14 as depicted in FIG. 2 in the semiconductor device of the first embodiment, the number of guard rings 14 is actually determined as appropriate depending on the type of each semiconductor chip 8. As can be seen from FIG. 2, the low electrification covering 9 is fitted only on that part of each wire 3 which is located immediately above the guard rings 14, wherein the low electrification covering 9 is made of such a low electrification material as silicone rubber, high-rigidity gel or polyimide resin which contains a low concentration (preferably 1 ppm or less) of ionic substances (e.g., $Na^+$, $K^+$, $Cl^-$). Practically, a few wires 3 run immediately above the guard rings 14 in most cases. In this embodiment, the low electrification covering 9 is fitted around each wire 3 as shown in FIG. 4 in actuality. The low electrification covering 9 may be formed by applying the low electrification material directly to each wire 3 or by fitting a heat-shrink tube made of an appropriate low electrification material on each wire 3 and causing the tube to shrink by application of heat.

The semiconductor device of the first embodiment thus structured can suppress such phenomena as a buildup of electric charge 17 on a surface area of the guard rings 14 where an intense electric field is formed and conventionally experienced injection of the electric charge 17 from the wires 3 into the sealing material 12 (see FIG. 3) due to increased wire insulating properties achieved by the low electrification coverings 9 (see FIG. 2). Shown in FIG. 6 is an example of how much the electric charge can develop in the sealing material (gel) 12 and in the low electrification material (rubber) used for forming the low electrification coverings 9. It is apparent from FIG. 6 that the electric charge does not build up so much in the low electrification material of the low electrification coverings 9 as in the sealing material 12 even when subjected to an intense electric field. This obviously proves an advantage of the low electrification coverings 9.

Also, as indicated by actual measurements of the leak currents shown in FIG. 7, the semiconductor device of the first embodiment (FIG. 2) can suppress the leak current to approximately 1/100th of the leak current flowing in the semiconductor device of the comparative example (FIG. 3) of which wires 3 are not covered or coated with any anti-electric charge material. It follows that the above-described structure of the embodiment helps achieve more reliable insulating performance. Furthermore, it can be seen from FIG. 5 that the leak current flowing in the semiconductor device of the comparative example rises much earlier than in the semiconductor device of the first embodiment. This also proves that the structure of the embodiment obviously provides improved insulating performance.

In this embodiment, the low electrification covering 9 is fitted only on that part of each wire 3 which is located immediately above the guard rings 14 and, thus, another part of each wire 3 marked by a circle A in FIG. 2 where each wire 3 is bonded to an emitter 15 located on an upper surface of each semiconductor chip 8 is not provided with the low electrification covering 9. This structure ensures that the part of each wire 3 to be bonded marked by the circle A will not break as a result of heat shrinkage of the low electrification covering 9 occurring in a high-temperature cycle even though the low electrification covering 9 is made of a material harder than the sealing material (gel) 12. This serves to improve mechanical reliability of the semiconductor device.

The above-described structure of the first embodiment makes it possible to manufacture a semiconductor device in which a low electrification covering fitted on part of each wire located close to guard rings substantially restricts injection of electric charge from wires into a sealing material and suppresses an increase in leak current caused by the injected electric charge, thereby providing a high dielectric withstand voltage and high reliability to prevent switching errors and breakdown due to overcurrent of a semiconductor chip. This structure also makes it possible to efficiently manufacture a highly reliable semiconductor device at low cost because the low electrification covering need not be fitted all along each wire, thus reducing the amount of the low electrification material to be used and time required for fitting the low electrification covering.

It might be possible to structure a power module having a high dielectric withstand voltage and high reliability in which a layer of low electrification material containing silicone rubber, high-rigidity gel or polyimide resin as a primary constituent is disposed above guard rings so that an electric charge injected from wires through a sealing material is entrapped by the low electrification material without affecting the guard rings and the leak current is suppressed. However, it is needless to say that the structure of the present embodiment employing the low electrification covering fitted on each wire substantially suppresses injection of the electric charge from wires into the sealing material that is a major source of the leak current, so that the leak current can be suppressed in an efficient manner.

While the foregoing first embodiment shows an example in which the low electrification covering is fitted on that part of each wire which is located immediately above (or in the vicinity of) the guard rings 14, an area where the low electrification covering is fitted may exceed the width of the guard rings, yet providing the same advantageous effect as thus far discussed, if the low electrification material covers at least that part of each wire which is located immediately above the guard rings 14. Also, an increase in the leak current is related to the injection of the electric charge in a direction toward an upper part of each guard ring and, therefore, the aforementioned effect of suppressing the leak current is achieved if only approximately a semicylindrical part of each wire facing the guard rings is covered by the low electrification material. Furthermore, it is possible to increase the reliability of the semiconductor device in a high-temperature operating region by using insulative heat-resistant silicone rubber or heat-resistant resin which produces a lesser electric charge buildup than the sealing material in the low electrification coverings taking into consideration a temperature increase of the semiconductor device.

Second Embodiment

Figure 8:
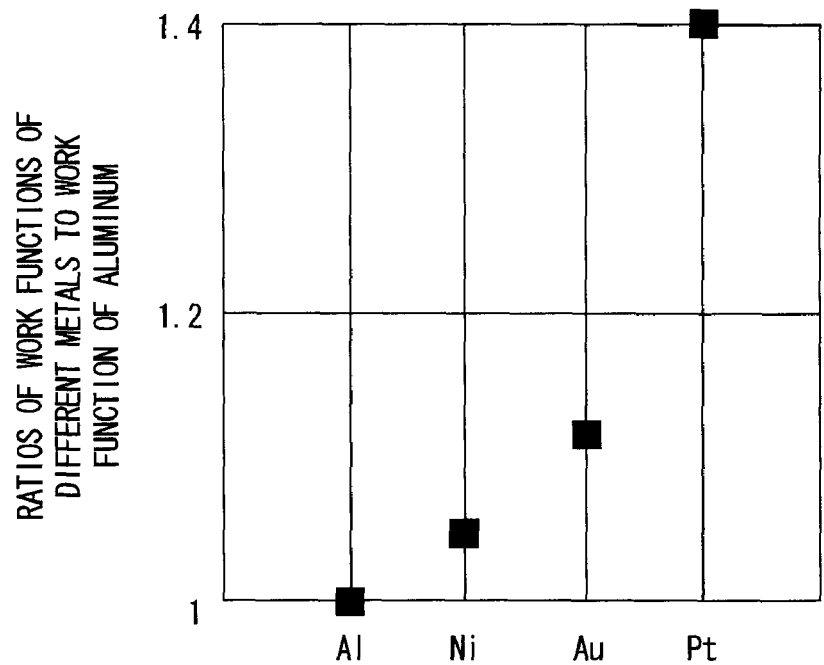
FIG. 8 is a diagram showing a comparison of a work function of aluminum and work functions of metallic materials which may be used in producing a semiconductor device according to a second embodiment of the invention.

Generally, aluminum is often used as a material of wires 3 in the manufacture of semiconductor devices for various reasons, such as relatively low cost and ease of manufacturing. FIG. 8 is a diagram showing a comparison of a work function of aluminum and work functions of metallic materials which may be used in producing a semiconductor device according to a second embodiment of the invention. Unlike the semiconductor device of the first embodiment employing the low electrification coverings 9, the semiconductor device of the second embodiment is characterized in that each wire 3 made of aluminum is plated with such a metal as nickel, gold or platinum having a higher work function than aluminum as shown in FIG. 8 so that a coating of such a metal is disposed around an outer surface of each wire 3. The work function represents the amount of energy required to remove an electric charge (electron) from a potential barrier of the surface of a solid medium into field-free space, so that the higher the work function of a metallic material, the more reduced is ejection of electrons from the material.

In the semiconductor device of the second embodiment thus structured, the wires 3 are coated with a metallic material having a high work function so that each wire 3 connected to an emitter 15 of each semiconductor chip 8 works as a negative electrode. Since the metallic material having a high work function restricts injection of a negative electric charge, the wires 3 plated with the metallic material having the high work function serve to restrict injection of the negative electric charge into a sealing material and suppress an increase in leak current caused by the injected electric charge, thereby providing a high dielectric withstand voltage and high reliability to prevent switching errors and breakdown due to overcurrent of a semiconductor chip.

If the metallic material having the high work function is plated only on that part of each wire which is located immediately above guard rings, it is possible to improve mechanical reliability of the semiconductor device especially at a joint between each wire and an electrode. Furthermore, since the metallic material having the high work function need not be plated all along each wire, the above-described structure of the second embodiment provides the same advantageous effect as the first embodiment, such as a reduction in manufacturing cost.

While the bare wires 3 are made of aluminum in the semiconductor device of the second embodiment, the invention is not limited thereto. For example, instead of plating the aluminum wires 3, the entirety of the wires 3 may be made of a metallic material, such as nickel, gold or platinum, having a higher work function than aluminum. This variation of the second embodiment provides the same advantageous effect as the second embodiment. Additionally, this variation eliminates the need for a process of plating the wires 3, making it possible to efficiently manufacture a highly reliable semiconductor device with reduced manufacturing time and at low cost.

Moreover, if a surface of the emitter 15 formed on each semiconductor chip 8 is plated with a metallic material having a higher work function than aluminum, it would be possible to reduce the amount of electric charge released from each semiconductor chip 8, making it possible to further suppress the leak current and manufacture a yet more reliable semiconductor device.

While the individual wires 3 are covered by the low electrification material or a plated layer of the metallic material having a high work function in portions in the vicinity of the guard rings 14 in the above-described first and second embodiments, respectively, the invention is not limited to these structures. For example, the wires 3 may be covered by both the low electrification material and the plated layer of the metallic material having a high work function. Also, while the individual wires 3 are covered by the low electrification material or the plated layer of the metallic material having a high work function only in the vicinity of the guard rings 14 in the aforementioned embodiments, the invention is not limited thereto. If the cost reduction is not of great importance, the low electrification covering 9 made of the low electrification material, the plated layer of the metallic material having a high work function, or both may be provided all along each wire 3 to achieve the same advantageous effect with respect to leak current suppression.

Third Embodiment

Figure 9:
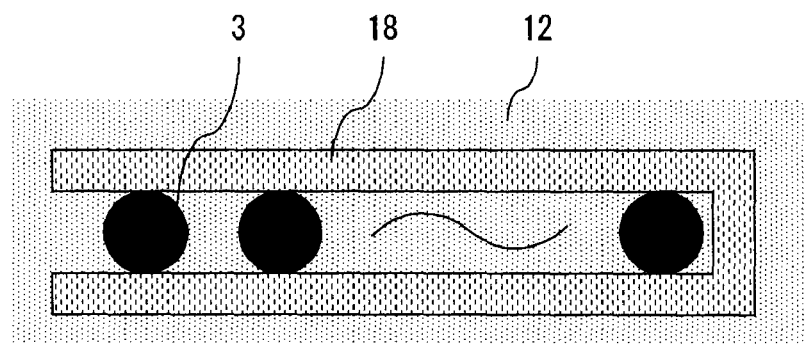
FIG. 9 is a cross-sectional view showing a principal part of a semiconductor device according to a third embodiment of the invention.

While the individual wires 3 are separately covered by at least the low electrification material or the plated layer of the metallic material having a high work function in the foregoing embodiments, the invention is not limited to these structures. For example, two or more wires 3 may be wrapped together by means of a strip of tape 18 made of or containing a low electrification material or a metallic material having a high work function as illustrated in FIG. 9 which is a cross-sectional view showing a principal part of a semiconductor device according to a third embodiment of the invention. This structure helps reduce the amount of labor required for handling the individual wires 3, yet providing the same advantageous effect as discussed in the first and second embodiments. Specifically, like the structures of the foregoing embodiments, the structure of the third embodiment produces the effect of restricting injection of the electric charge from the wires 3 into the sealing material and makes it possible to efficiently manufacture a highly reliable semiconductor device having a high withstand voltage.

While the wires 3 are used for establishing electrical connections in the semiconductor devices of the foregoing embodiments, means for establishing electrical connections is not limited to the wires 3. For example, the invention is applicable to a semiconductor device employing ball electrodes having a ball-shaped electrode surface covered by a low electrification material or plated with a metallic material having a high work function, or employing ball electrodes made of a metallic material having a high work function, as means for establishing electrical connections. The invention is also applicable to a semiconductor device employing an interposer, a printed circuit board or direct leads for wire-free connection of each chip and external terminals as means for establishing electrical connections. Needless to say, the invention confers the same advantageous effect as discussed above with reference to the foregoing embodiments.

Although the invention has been explained with reference to the semiconductor devices employing a case-and-lid type encapsulation technique, the invention is similarly applicable to semiconductor devices manufactured by other techniques, such as transfer mold process, still producing the same advantageous effect. The invention is also applicable to semiconductor devices provided with a built-in heat sink or a separate heat sink, as well as to semiconductor devices incorporating silicon chips, SiC chips, diodes, other types of transistors than IGBTs and/or integrated circuits (ICs), for instance, yet producing the same advantageous effect.

Furthermore, the invention is applicable with the same advantageous effect to various types of semiconductor devices, such as a junction type in which electrodes are electrically connected to a base plate and semiconductor chips by fused metal joining like soldering, a mechanical contact type in which electrodes are electrically connected to a base plate and semiconductor chips by application of mechanical pressure exerted inward from outside the electrodes by means an elastic member or bolting, and a junction and mechanical contact combination type.

Various modifications and alterations of this invention will be apparent to those skilled in the art without departing from the scope and spirit of this invention, and it should be understood that this is not limited to the illustrative embodiments set forth herein.

What is claimed is:

1. A semiconductor device comprising:
    an insulator substrate mounted on a base plate, said insulator substrate having an electrode;
    a semiconductor chip mounted on said insulator substrate;
    external terminals for establishing external electrical connections of said semiconductor device;
    means for establishing electrical connections among said external terminals, said electrode and said semiconductor chip, said means for establishing electrical connections separate from the external terminals;
    a case accommodating said insulator substrate, said semiconductor chip, said external terminals and said means for establishing electrical connections which are sealed by a sealing material filled in said case, said means for establishing electrical connections completely encapsulated within the sealing material;
    a lid for protecting an upper part of said sealing material; and
    an insulative low electrification material covering only a portion of said means for establishing electrical connections, said low electrification material having a lesser tendency to produce an electric charge buildup than said sealing material.

2. The semiconductor device according to claim 1, wherein a guard ring is formed on said semiconductor chip and said low electrification material covers only that part of said means for establishing electrical connections which is located in the vicinity of said guard ring.

3. The semiconductor device according to claim 1, wherein said low electrification material is formed into a tape which surrounds more than one of said means for establishing electrical connections.

4. A semiconductor device comprising:
    an insulator substrate mounted on a base plate, said insulator substrate having an electrode;
    a semiconductor chip mounted on said insulator substrate;
    external terminals for establishing external electrical connections of said semiconductor device;
    means for establishing electrical connections among said external terminals, said electrode and said semiconductor chip, said means for establishing electrical connections separate from the external terminals;
    a case accommodating said insulator substrate, said semiconductor chip, said external terminals and said means for establishing electrical connections which are sealed by a sealing material filled in said case;
    a lid for protecting an upper part of said sealing material; and
    a metallic material covering only a portion of said means for establishing electrical connections, said metallic material having a work function higher than that of said means for establishing electrical connections.

5. The semiconductor device according to claim 4, wherein a guard ring is formed on said semiconductor chip and said metallic material covers only that part of said means for establishing electrical connections which is located in the vicinity of said guard ring.

6. The semiconductor device according to claim 4, wherein said metallic material surrounds more than one of said means for establishing electrical connections.

7. The semiconductor device according to claim 1, wherein the means for establishing electrical connections is a plurality of wires.

8. The semiconductor device according to claim 4, wherein the means for establishing electrical connections is a plurality of wires.

9. A semiconductor device comprising:
- an insulator substrate mounted on a base plate, said insulator substrate having an electrode;
- a semiconductor chip mounted on said insulator substrate;
- external terminals for establishing external electrical connections of said semiconductor device;
- means for establishing electrical connections among said external terminals, said electrode and said semiconductor chip;
- a case accommodating said insulator substrate, said semiconductor chip, said external terminals and said means for establishing electrical connections which are sealed by a sealing material filled in said case, said means for establishing electrical connections completely encapsulated within the sealing material;
- a lid for protecting an upper part of said sealing material; and
- an insulative low electrification material covering only said means for establishing electrical connections, said low electrification material having a lesser tendency to produce an electric charge buildup than said sealing material;
- wherein the insulative low electrification material is rubber.

10. The semiconductor device according to claim 7, wherein each wire is individually wrapped with the insulative low electrification material.

11. The semiconductor device according to claim 8, wherein each wire is made of aluminum, said metallic material is selected from the group consisting of nickel, gold, and platinum, and each individual wire is plated with said metallic material.

12. The semiconductor device according to claim 1, wherein the insulative low electrification material is a gel.

13. The semiconductor device according to claim 1, wherein the insulative low electrification material is a polymide resin.

14. The semiconductor device according to claim 1, wherein the insulative low electrification material has a concentration of an ionic substance which is 1 ppm or less.

* * * * *